(12) United States Patent
Abadeer et al.

(10) Patent No.: US 7,167,053 B2
(45) Date of Patent: Jan. 23, 2007

(54) INTEGRATED CIRCUIT AMPLIFIER DEVICE AND METHOD USING FET TUNNELING GATE CURRENT

(75) Inventors: Wagdi W. Abadeer, Jericho, VT (US); Anthony R. Bonaccio, Shelburne, VT (US); Kiran V. Chatty, Williston, VT (US); John A. Fifield, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 10/904,238

(22) Filed: Oct. 29, 2004

(65) Prior Publication Data

US 2006/0091951 A1    May 4, 2006

(51) Int. Cl.
*H03F 3/16* (2006.01)
*H03F 3/45* (2006.01)
*H03G 3/12* (2006.01)

(52) U.S. Cl. .................... 330/277; 330/283; 330/253
(58) Field of Classification Search .............. 330/283
See application file for complete search history.

(56) References Cited

U.S. PATENT DOCUMENTS

| | | | |
|---|---|---|---|
| 4,340,867 A | 7/1982 | Sano | 330/277 |
| 5,464,792 A * | 11/1995 | Tseng et al. | 438/585 |
| 6,335,657 B1 | 1/2002 | Hayase et al. | 327/560 |
| 6,605,996 B1 * | 8/2003 | Yu et al. | 330/253 |
| 6,819,166 B1 * | 11/2004 | Choi et al. | 327/551 |

OTHER PUBLICATIONS

Junjun Li, Robert Gauthier*, and Elyse Rosenbaum, "A Compact, Timed-shutoff, MOSFET-based Power Clamp for On-chip ESD Protection", Dept of Electrical and CopmputerEngineering, University of Illinois at Urbana-Champaign,* IBM Semiconductor Research and DevelopmentCenter, VT, p. 2-5.

* cited by examiner

*Primary Examiner*—Robert Pascal
*Assistant Examiner*—Alan Wong
(74) *Attorney, Agent, or Firm*—Michael J. LeStrange; Cantor Colburn LLP

(57) ABSTRACT

An integrated circuit amplifier includes, in an exemplary embodiment, a first field effect transistor (FET) device configured as a common source amplifier with source degeneration and a second FET device configured as a tunneling gate FET, the tunneling gate FET coupled to the source follower. The tunneling gate FET is further configured so as to set a transconductance of the amplifier and the common source amplifier with source degeneration is configured so as to set an output conductance of the amplifier.

20 Claims, 15 Drawing Sheets

INTEGRATED CIRCUIT AMPLIFIER DEVICE AND METHOD USING FET TUNNELING GATE CURRENT

BACKGROUND

The present invention relates generally to semiconductor devices, and, more particularly, to an integrated circuit amplifier device and method utilizing FET tunneling gate current.

Amplifiers are commonly used in RF and analog applications. For a field effect transistor (FET) amplifier, a high gain associated therewith generally results from a device having a large gate width. The gain of an FET amplifier is given by the expression:

$$\text{Gain} = G_m/G_{ds} \quad \text{(eq. 1);}$$

wherein $G_m$ and $G_{ds}$ are, respectively, the transconductance and output conductance of the FET. In turn, the transconductance, $G_m$, of the FET is given by the expression:

$$G_m = d(I_D)/d(V_g) \text{ at a given value of } V_{ds} \quad \text{(eq. 2);}$$

while the output conductance of the FET is given by the expression:

$$G_{ds} = d(I_D)/d(V_{ds}) \text{ at a given value of } V_g \quad \text{(eq. 3).}$$

The transconductance of an FET is strongly dependent upon the channel length of the device (i.e., the shorter the channel length, the greater the transconductance of the FET). However, given certain technologies having minimum channel lengths associated therewith, the value of $G_m$ cannot be arbitrarily increased. Moreover, the peak value of transconductance occurs at a specific gate voltage for a minimum channel length and, as such, the FET amplifier would need to be designed for that specific gate voltage to take advantage of the peak $G_m$. Thus, the voltage options for the design of a conventional FET amplifier are limited in this sense. Furthermore, because a high output voltage ($V_{ds}$) is desired, and since the input voltage $V_{gs}$ could be at low overdrive (or at 0.5 $V_{ds}$), both of these conditions can lead to hot carrier degradation. FIG. 1 is a graph that illustrates the degradation of amplification factor due to hot carrier effects.

Since $G_m$ and $G_{ds}$ for a conventional FET amplifier are not decoupled from each other, but rather are both dependent upon the design of a given FET, each parameter cannot be independently optimized with respect to one another for gain purposes (i.e., increasing $G_m$ while also decreasing $G_{ds}$ for the same device). Still a further consideration is the fact that the frequency response of the amplifier is limited by the gate oxide capacitance, which increases as CMOS scaling is intensified. The increase of gain is again coupled with optimization of the frequency response, since the two parameters are controlled by the same FET with an ultra-thin gate oxide.

Accordingly, it would be desirable to have an integrated circuit amplifier device in which the various gain parameters are capable of independent optimization with respect to one another.

SUMMARY

The foregoing discussed drawbacks and deficiencies of the prior art are overcome or alleviated by an integrated circuit amplifier including, in an exemplary embodiment, a first field effect transistor (FET) device configured as a common source amplifier with source degeneration and a second FET device configured as a tunneling gate FET, the tunneling gate FET coupled to the common source amplifier with source degeneration. The tunneling gate FET is further configured so as to set a transconductance of the amplifier and the common source amplifier with source degeneration is configured so as to set an output conductance of the amplifier.

In another embodiment, an integrated circuit differential amplifier includes a first field effect transistor (FET) device configured as a first common source amplifier with source degeneration, a second FET device configured as a second common source amplifier with source degeneration, a third FET device configured as a first tunneling gate FET, the first tunneling gate FET coupled between the first common source amplifier with source degeneration and the second common source amplifier with source degeneration, and a fourth FET device configured as a second tunneling gate FET, the second tunneling gate FET coupled between the first common source amplifier with source degeneration and the second common source amplifier with source degeneration. The first and second tunneling gate FETs are further configured so as to set a transconductance of the differential amplifier, and the first and second common source amplifier with source degenerations are configured so as to set an output conductance of the differential amplifier.

In still another embodiment, a method for implementing an integrated circuit amplifier comprises configuring a first field effect transistor (FET) device as a common source amplifier with source degeneration, and configuring a second FET device as a tunneling gate FET coupled to the common source amplifier with source degeneration. The tunneling gate FET is further configured so as to set a transconductance of the amplifier, and the common source amplifier with source degeneration is configured so as to set an output conductance of the amplifier.

BRIEF DESCRIPTION OF THE DRAWINGS

Referring to the exemplary drawings wherein like elements are numbered alike in the several Figures.

DETAILED DESCRIPTION

Disclosed herein is an integrated circuit amplifier device and method that independently optimizes the gain parameters and frequency response of an FET device by utilizing the highly non-linear relationship between gate tunneling current and gate voltage for ultra-thin gate oxides. Briefly stated, a two-terminal amplifier device is configured in which an ultra-thin gate oxide RET device (e.g., having a thickness of about 0.8 nm to about 2.2 nm) used to control transconductance, in combination with a thick oxide common source amplifier with source degeneration (e.g., having a thickness of about 5.0 nm to about 7.0 nm) for controlling the output conductance of the amplifier device.

A maximum tunneling current for the ultra-thin gate oxide FET is obtained with the source and drain terminals thereof at ground, with the channel inverted, and with $V_g$ biased above threshold voltage ($V_t$). For this two-terminal device, the gate thereof could be biased at a DC voltage, with a small signal superimposed thereon for amplification. For such a tunneling gate amplifier (TGA), there are no hot carrier effects, and no degradation under normal conditions. With the tunneling gate amplifier device used in combination with a thick gate oxide common source amplifier with source degeneration, sufficient gain can be achieved with a good frequency bandwidth, and the device dimensions can be properly chosen to achieve optimum performance and reliability. Thereby, the device parameters $G_m$, $G_{ds}$, gain and frequency response may be independently optimized.

Figure 1:
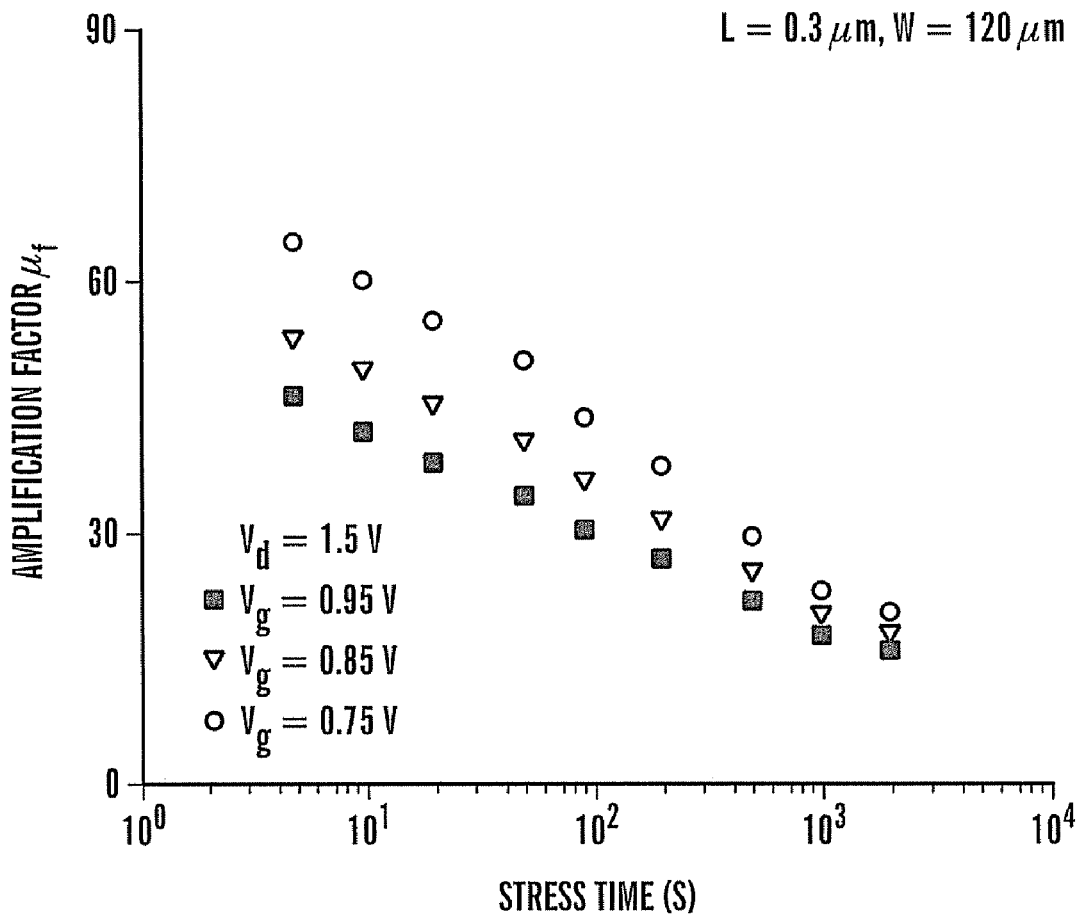
FIG. 1 is a prior art graph that illustrates the degradation of amplification factor due to hot carrier effects.
Figure 2:
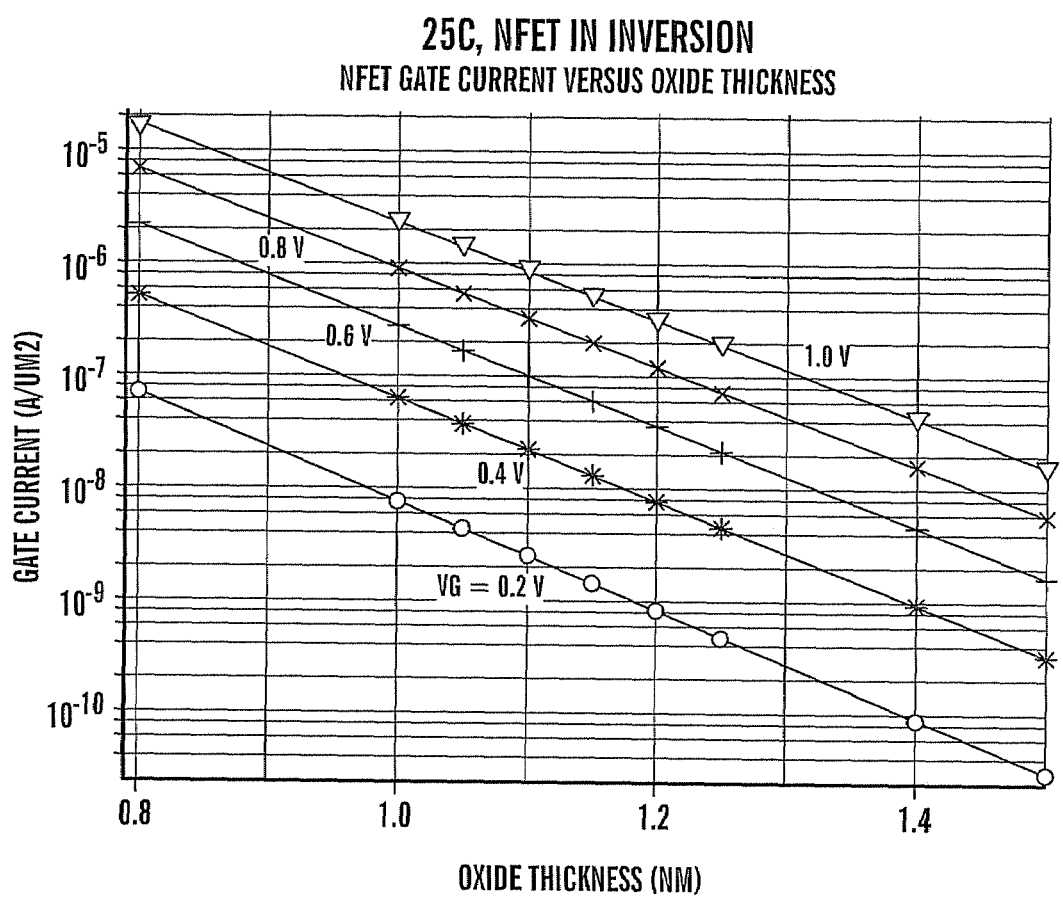
FIG. 2 is a graph that illustrates gate tunneling current characteristics of an FET as function of oxide thickness for different values of gate voltage.
Figure 3:
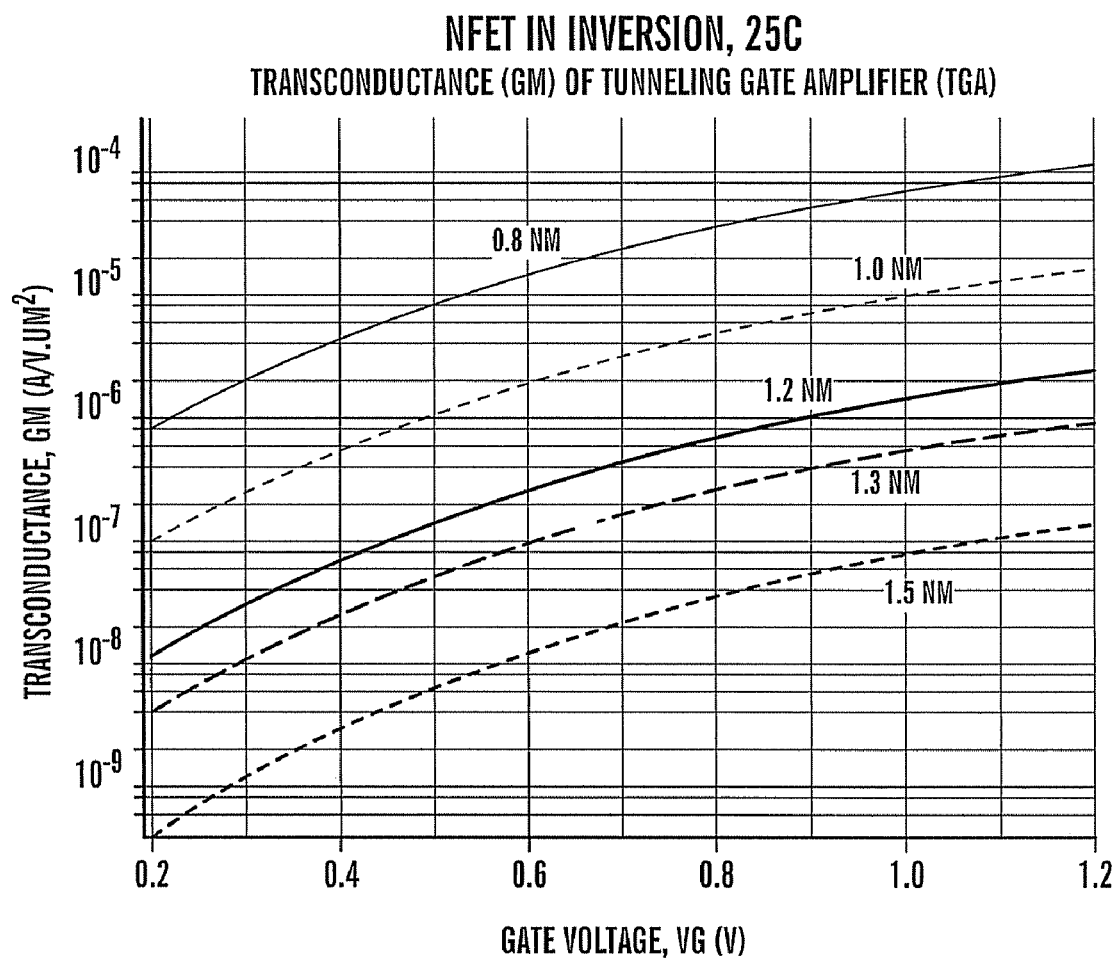
FIG. 3 is a graph illustrating transconductance of the tunneling FET, as a function of gate voltage, for different oxide thicknesses.

Referring flow to FIG. 2, there is shown a graph that illustrates gate tunneling current characteristics of an FET as function of oxide thickness (at 25° C.), for different values of gate voltage. The source, drain and substrate of the FET are all at ground potential. The transconductance, $G_m$, of the tunneling FET, given in A/(V·μm$^2$) and calculated from (eq. 2), is illustrated in FIG. 3 as a function of gate voltage at 25° C. for different oxide thicknesses.

Figure 4:
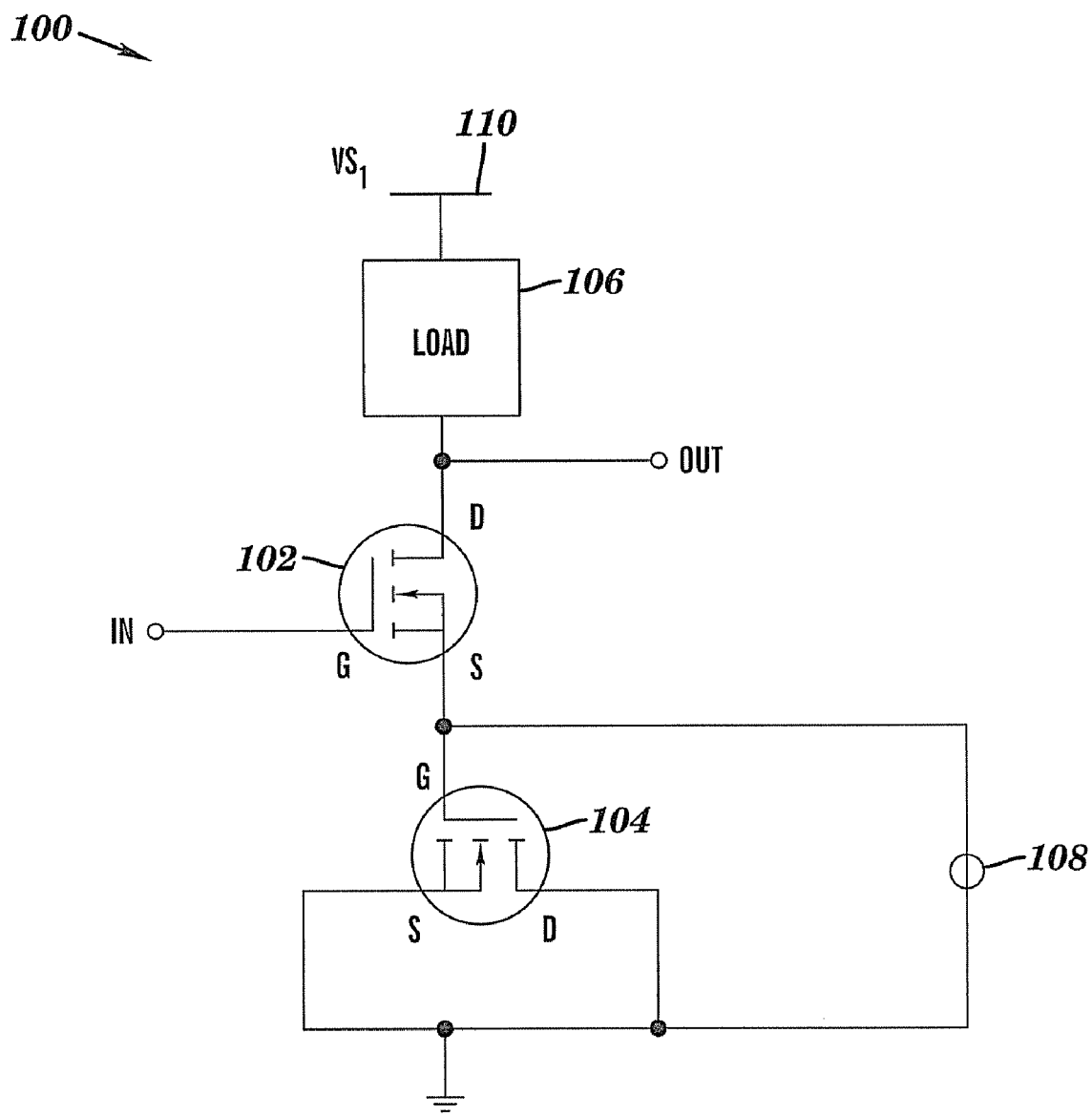
FIG. 4 is a schematic diagram of a novel tunneling amplifier circuit that includes a first FET device configured as a common source amplifier with source degeneration, in which the source terminal thereof is coupled to the gate terminal of a second device configured as a tunneling FET, in accordance with an embodiment of the invention.

In accordance with an embodiment of the invention, FIG. 4 is a schematic diagram of a novel tunneling amplifier circuit 100 that includes a first FET device 102 configured as a common source amplifier with source degeneration, in which the source terminal thereof is coupled to the gate terminal of a second FET device 104 configured as a tunneling FET. Thus configured, the transconductance of the tunneling device 104 effectively sets the transconductance of the circuit. The resultant current change in the tunneling device 104 now appears at the drain of the common source amplifier with source degeneration 102. Furthermore, this current can be pulled through a load 106 (e.g., a traditional load or another tunneling device, if a low gain is desired) to create an amplified voltage output signal. The load 106 is connected to a supply voltage (VS$_1$) 110. In addition, a current source 108 may be configured in parallel with the tunneling FET 104 for increasing the total current into the common source amplifier with source degeneration 102, allowing for more optimization of the circuit gain.

Since the tunneling structure 104 is essentially a leaky capacitor, the gain of the amplifier circuit 100 will have a frequency response influenced by the tunneling structure. At DC and low frequencies, the gain should be a function of the transconductance $G_m$ of the tunneling structure, as defined above. The −3 dB point of the rollover in gain should occur at $1/2\pi R_0 C_T$, wherein $R_0$ is the output resistance of the NFET common source amplifier with source degeneration 102 and $C_T$ is the capacitance of the tunneling FET 104. The voltage amplification of the circuit 100 is provided between the input (In) and output (Out) voltages.

Figure 5:
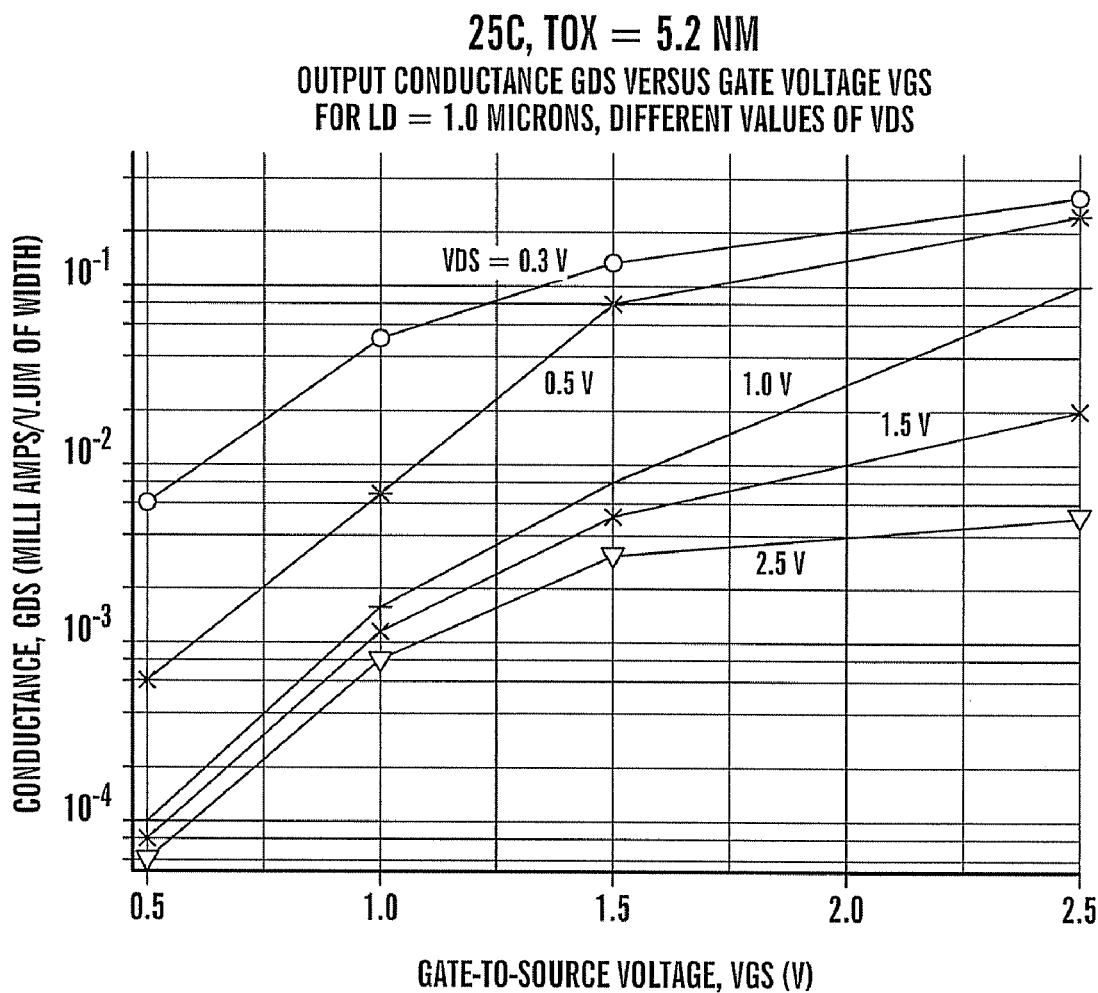
FIG. 5 is a graph illustrating the output conductance of the common source amplifier with source degeneration as function of gate-to-source voltage at a channel length of 1.0 μm, for different values of drain-to-source voltage.
Figure 6:
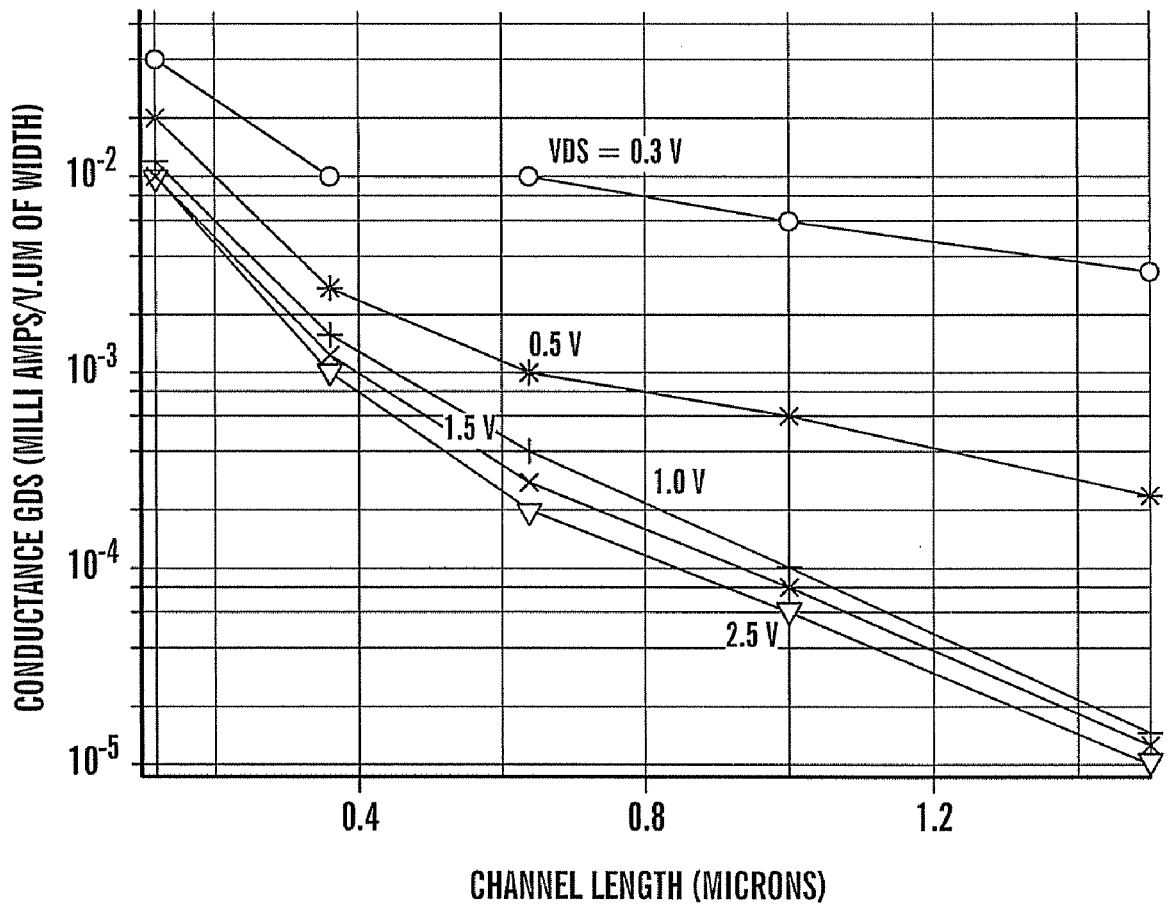
FIG. 6 is a graph illustrating the output conductance of the common source amplifier with source degeneration as a function of channel length (in microns) at a gate-to-source voltage of 0.5 volts, for different values of drain-to-source voltage.

The load circuit 106 may be either another tunneling structure or a traditional current source. Once again, the output conductance of the NFET common source amplifier with source degeneration 102 must be significantly lower than the transconductance of the tunneling device 104 to allow the circuit 100 to have gain. In order to reduce output conductance of the common source amplifier with source degeneration 102 (and thus increase the gain of the circuit 100), a thick oxide device (e.g., 5.2 nm) is utilized for the common source amplifier with source degeneration 102. FIG. 5 is a graph illustrating the output conductance $G_{ds}$ of the common source amplifier with source degeneration 102 as function of gate-to-source voltage ($V_{gs}$) at a channel length of 1.0 μm, for different values of drain-to-source voltage ($V_{ds}$). FIG. 6 is a graph illustrating the output conductance of the common source amplifier with source degeneration 102 as a function of channel length (in microns) at a gate-to-source voltage $V_{gs}$=0.5 volts, for different values of drain-to-source voltage ($V_{ds}$).

In order to optimize the design of the common source amplifier with source degeneration 102, the tunneling FET 104, and the current source 108 each of the design parameters are considered in the following equations:

Tunneling FET

The gate tunneling current density, $I_{gd}$, of the tunneling FET 104 is given by:

$$\mathrm{Log}(I_{gd}) = AN_2 + [AN_1 \cdot T_{ox}] \qquad \text{(eq. 4)};$$

wherein the gate current density $I_{gd}$ is expressed in units of amperes per square micron (A/μm$^2$), and $T_{ox}$ is the gate oxide thickness in nanometers (nm). $AN_1$ and $AN_2$ are parameters that are functions of the gate voltage $V_g$. $AN_1$ and $AN_2$ may in turn be expressed as follows:

$$AN_1=[0.673 \cdot Log(V_g)]-9.917 \quad (eq. 5);$$

$$AN_2=-9.685 \cdot exp[-1.159 \cdot V_g] \quad (eq. 6).$$

The complete expression of the NFET tunneling gate current density (in A/μm$^2$) as function of temperature, oxide thickness and gate voltage is:

$$Log(I_{gd})=AN_2+[AN_1 \cdot T_{ox}]+\{\Delta H[(1/T_1)-(1/T_2)]/K\} \quad (eq. 7)$$

wherein K is Bolztman's constant, $T_1$ is 298° K. (25° C.), $T_2$ is the application temperature in ° K., and ΔH is the activation energy which is equal to 0.017 eV. The tunneling gate current $I_g$ (in Amperes) is given by:

$$I_g=I_{gd} \cdot W_T \cdot L_T \quad (eq. 8);$$

where $W_T$ and $L_T$ are, respectively, the width and length of the tunneling FET 104 in microns. The transconductance, in terms of density, in units of A/(V·μm$^2$) for the tunneling FET 104 is calculated from eq. 2 with replacing device current $I_D$ by gate current $I_g$ for the two-terminal FET 104. The transconductance, in density, is designated by $G_{md}$ and is given by:

$$G_{md}=I_{gd} \cdot \{[0.673 \cdot T_{ox}/V_g]+[11.225 \cdot exp(-1.159 \cdot V_g)]\} \quad (eq. 9).$$

Thus, the transconductance of the tunneling FET 104 in (A/V) as a function of gate current density, channel length, channel width and temperature is given by:

$$G_m=G_{md} \cdot W_T \cdot L_T = I_{gd} \cdot W_T \cdot L_T \cdot KT \quad (eq. 10);$$

where $KT=[0.673 \cdot T_{ox}/V_g]+[11.225 \cdot exp(-1.159 \cdot V_g)]$

As described hereinafter, the current source 108 in parallel with the tunneling FET 104 provides an additional source of current, designated by $I_S$, and may be used for optimization of the circuit gain and frequency response.

Common Source Amplifier with Source Degeneration

The output conductance of the common source amplifier with source degeneration 102, in (A/V), may be expressed as follows:

$$G_{ds}=W_S \cdot B1 \cdot exp[(A2 \cdot V_{gs})-(C2 \cdot L_S)] \quad (eq. 11)$$

Again, the common source amplifier with source degeneration 102 is preferably made from a thick gate oxide (e.g., 5.2 nm). $V_{gs}$, $W_S$, and $L_S$ are, respectively, the gate to source voltage, channel width and channel length, of the common source amplifier with source degeneration. The values of the parameters B1, A2 and C2 are functions of $V_{ds}$, the drain-to-source voltage of the common source amplifier with source degeneration 102. Equation (11) is valid for $L_S$ in the range of about 0.5 μm to about 1.5 μm, and for $V_g$ in the range of about 0.5 V to about 1.0 V. For $V_{ds}$ of about 1.5 V, B1=0.0003, A2=5.2961, and C2=3.8274.

The common source amplifier with source degeneration 102 operates in the saturation range wherein the drain current there through is equal to the gate tunneling current ($I_g$) of the tunneling FET 104. This gate current in turn is equal to the drain to source current of the common source amplifier with source degeneration 102, which is given by:

$$I_g=[W_S/(2 \cdot L_S)] \cdot \mu_n \cdot C_i \cdot V_{dsat}^2 \quad (eq. 12)$$

wherein $\mu_n$ is the electron mobility, $C_i$ is the gate oxide capacitance/unit area, and $V_{dsat}$ is given by:

$$V_{dsat}=V_{gs}-V_t \quad (eq. 13)$$

$V_t$ is the threshold voltage in saturation, which is about 0.4 volts. $V_{gs}$ for the common source amplifier with source degeneration 102 is given by:

$$V_{gs}=VS_2-V_g \quad (eq. 14);$$

where $VS_2$ is the input voltage to the gate of the common source amplifier with source degeneration and $V_g$ is the gate voltage of the tunneling FET 104. The drain-to-source voltage of the common source amplifier with source degeneration ($V_{ds}$) is >$V_{dsat}$. The load resistor $R_L$ (i.e., load 106) has a voltage thereacross of about 0.05 volts. The $V_{ds}$ for the common source amplifier with source degeneration is given by:

$$V_{ds}=VS_1-0.05-V_g \quad (eq. 15);$$

where $VS_1$ is the supply voltage 110 connected to the load resistor $R_L$.

Circuit Gain

The circuit gain for the tunneling gate amplifier 100 is given by:

$$Gain=(G_{md} \cdot W_T \cdot L_T)/G_{ds} \quad (eq. 16).$$

From equations (11), (12), and (16), the gain can also be expressed as:

$$Gain=(I_{gd} \cdot W_T \cdot L_T \cdot KT) \cdot exp[(C2 \cdot L_S)-(A2 \cdot V_{gs})] \cdot (\mu_n \cdot Ci \cdot V_{dsat}^2)/[B1 \cdot 2 \cdot L_S \cdot I_{gd} \cdot W_T \cdot L_T] \quad (eq. 17)$$

This may be further expressed as:

$$Gain=KT \cdot exp[(C2 \cdot L_S)-(A2 \cdot V_{gs})] \cdot (\mu_n \cdot Ci \cdot V_{dsat}^2)/[B1 \cdot 2 \cdot L_S] \quad (eq. 18).$$

As can be seen from (eq. 18), the circuit gain is independent of $I_{gd}$, which is the current density of the tunneling FET 104. The gain is also independent of the dimensions of the tunneling FET 104 ($W_T$ and $L_T$). However, the circuit gain increases with increasing $L_S$ and $V_{gs}$ for the common source amplifier with source degeneration 102. It should also be noted that, for a given channel length ($L_S$) of the common source amplifier with source degeneration 102, the channel width thereof has to satisfy (eq. 12).

With regard to the current source 108, the transconductance $G_m$ for the parallel combination of the tunneling FET 104 and the current source 108 is the same as would be the case where the tunneling FET 104 is used without the current source 108. This is due to the fact that because the current value of the current source 108 remains constant and does not change with gate voltage. Accordingly, the derivative of the total current with respect to voltage will be the same as that for the tunneling FET. The circuit gain when constant current source 108 is used is expressed by:

$$Gain=(I_{gd} \cdot W_T \cdot L_T) \cdot KT \cdot exp[(C2 \cdot L_S)-(A2 \cdot V_{gs})] \cdot (\mu_n \cdot Ci \cdot V_{dsat}^2)/\{B1 \cdot 2 \cdot L_S \cdot [(I_{gd} \cdot W_T \cdot L_T)+I_S]\} \quad (eq. 19).$$

As can be seen from (eq. 19), when adding a constant current source 108 in parallel with the tunneling FET 104, the circuit gain decreases with increasing $I_S$ due to the increase in total current and corresponding increase in the width and conductance $G_{ds}$ for the common source amplifier with source degeneration 102. Also, in adding the constant current source 108, the gain will increase with increasing area of tunneling FET 104, provided that the magnitude of the current source 108 is significantly larger than the gate current of the tunneling FET 104.

−3 dB Upper Frequency Point For Gain

The −3 dB point of the rollover in gain is $F_U=\frac{1}{2}\pi R_0 C_T$, where $R_0$ is the output resistance of the NFET common source amplifier with source degeneration and $C_T$ is the total capacitance of the combination of the tunneling FET and the common source amplifier with source degeneration. The total capacitance is determined as follows:

$$C_T = (6.641 \cdot L_S \cdot W_S) + (34.531 \cdot L_T \cdot W_T / T_{ox}) \text{fF} \quad \text{(eq. 20)}$$

where $L_S$, $W_S$, $L_T$, and $W_T$ are all in microns and $T_{ox}$ is in nm. The load resistance $R_L$ (106) is given by $V_L/(I_g+I_S)$, wherein as described above, $V_L$ is the voltage across the output resistor and is equal to about 0.05 volts. Using (eq. 12) and (eq. 13), and for a general case where a constant current source is included, the upper frequency roll-off point is expressed as:

$$F_U = \{[(10 \cdot W_S/L_S) \cdot \mu_n \cdot Ci \cdot (V_{gs}-V_t)^2] + I_S\} \cdot 10^{15} / \{2\pi \cdot [(6.641 \cdot L_S \cdot W_S) + (34.531 \cdot L_T \cdot W_T / T_{ox})]\} \text{Hz} \quad \text{(eq. 21)}.$$

For the case where $I_S=0$, it will be noted that $W_S$, for a given $L_S$, is determined by (eq. 12), which gives Ws as direct function of the tunneling gate current and the area of the tunneling RET 104. If the gate capacitance of the tunneling RET 104 is much larger than that of the current source, then $F_U$ will be independent of the area of the tunneling FET 104. In any case, $F_U$ decreases with increasing $L_S$, and increases with increasing $V_{gs}$.

For the case when the parallel constant current source 108 is not zero, and if $I_S$ is greater than the gate current of the tunneling RET 104, then the −3 dB frequency point will decrease with increasing area of the tunneling FET 104. Again, $F_U$ will decease with increasing $L_S$, and increase with increasing $V_{gs}$. $F_U$ will also increase with increasing value of the current source $I_S$.

In order to illustrate the effect of the above described design parameters on the amplifier output gain and −3 dB upper frequency ($F_U$), 4 design examples (cases) are considered and are presented in Table 1.

TABLE 1

| Parameter | Case 1 | Case 2 | Case 3 | Case 4 |
|---|---|---|---|---|
| $T_{ox}$ of Tunneling FET (nm) | 1.0 | 1.2 | 1.2 | 1.2 |
| $VS_1$ Supply Voltage (volts) | 2.5 | 2.5 | 2.5 | 2.5 |
| $V_g$ of Tunneling FET/Source of Common Source Amplifier with Source Degeneration (volts) | 1.0 | 1.0 | 1.0 | 1.0 |
| Constant Current Source, $I_S$ (mA) | 0 | 0 | 2.0 | 2.0 |
| Gate Current Density of Tunneling FET (µA/µm²) | 2.34 | 0.32 | 0.32 | 0.32 |
| Area Range of Tunneling Amplifier (µm²) | 0.08–1.0 | 0.08–1.0 | 0.08–1.0 | 0.08–2.0 |
| Transconductance of Tunneling Amplifier (mA/V · µm²) | 0.01 | 0.0013 | 0.0013 | 0.0013 |
| Drain Voltage of Source Follower (volts) | 2.45 | 2.45 | 2.45 | 2.45 |
| $V_{ds}$ of Common Source Amplifier with Source Degeneration (volts) | 1.45 | 1.45 | 1.45 | 1.45 |
| $V_t$ of Common Source Amplifier with Source Degeneration (volts) | 0.4 | 0.4 | 0.4 | 0.4 |
| Voltage Across Load Resistor (volts) | 0.05 | 0.05 | 0.05 | 0.05 |
| Gate Oxide Capacitance of Tunneling Amplifier (fF/µm²) | 34.5 | 28.78 | 28.78 | 28.78 |
| Gate Oxide Capacitance of Common Source Amplifier with Source Degeneration (fF/µm²) | 6.64 | 6.64 | 6.64 | 6.64 |

Figure 7:
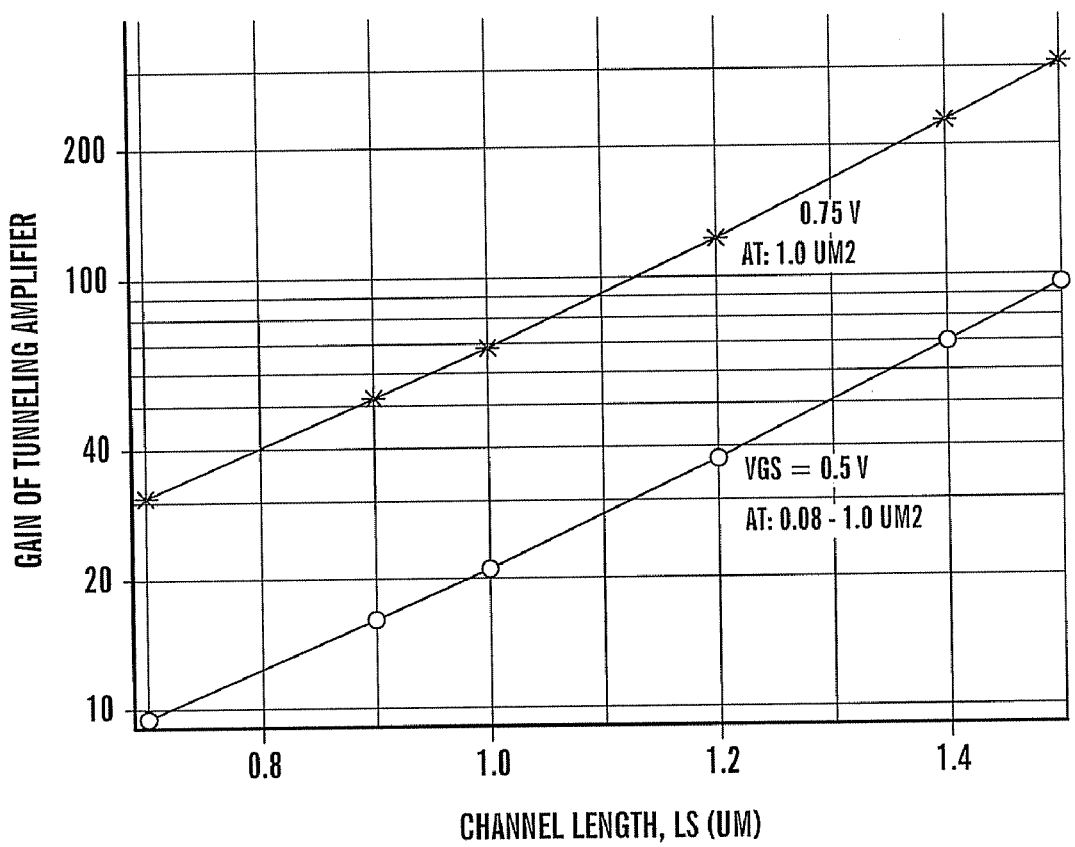
FIG. 7 is a graph illustrating the gain of tunneling amplifier as a function of channel length of the common source amplifier with source degeneration, for a first case of selected device parameters.
Figure 8:
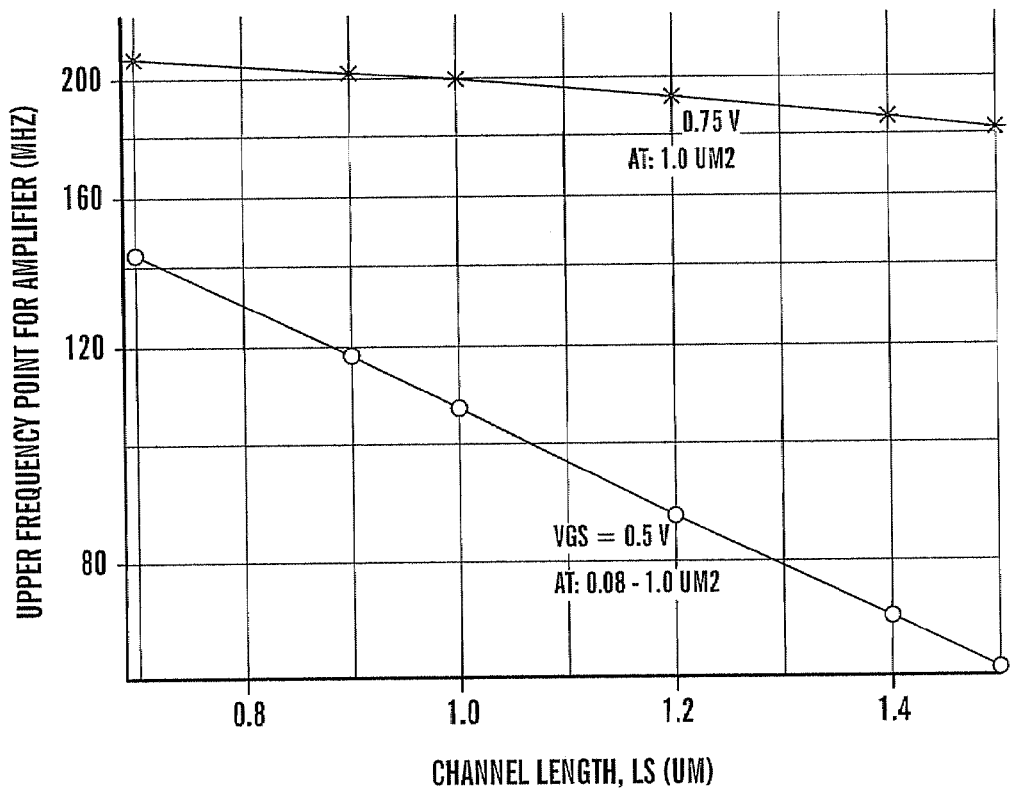
FIG. 8 is a graph illustrating the −3 dB upper frequency point as a function of channel length of the common source amplifier with source degeneration, for the first case of selected device parameters.

Using the parameters specified in Case 1, FIGS. 7 and 8 illustrate, respectively, the gain and −3 dB ($F_U$) frequency point as a function of channel length of the common source amplifier with source degeneration 102. These results show, as expected, increasing gain with increasing $L_S$ and $V_{gs}$. In addition, $F_U$ increases with $V_{gs}$ but decreases with increasing $L_S$. It will be noted that for the range of $L_S$ indicated in the Figures, $W_S$ for the common source amplifier with source degeneration is determined from (eq. 12) and is required to be equal to or greater than 0.3 µm. As an example, in FIGS. 7 and 8, for $V_{gs}=0.75$ V, the area of the tunneling FET cannot be less than 1.0 µm², so that $W_S$ is not less than 0.3 µm.

Figure 9:
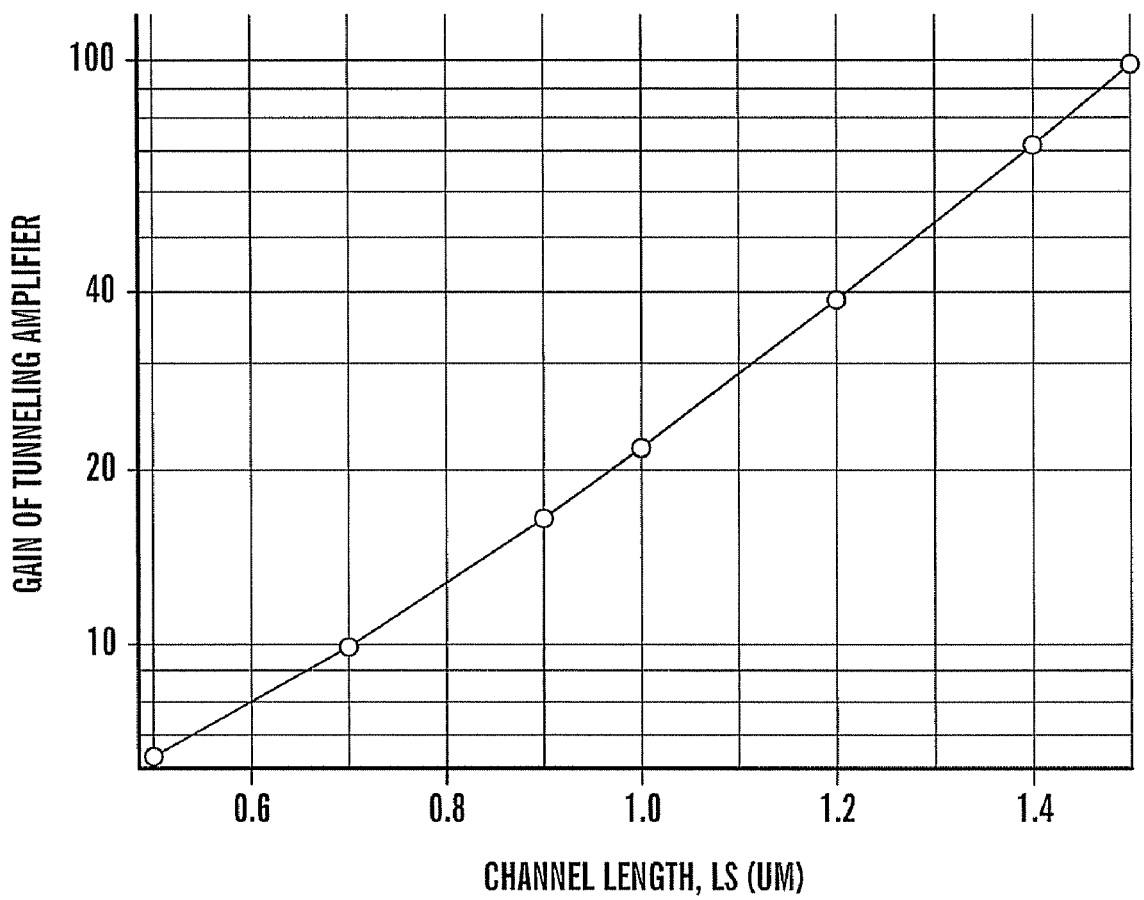
FIG. 9 is a graph illustrating the gain of tunneling amplifier as a function of channel length of the common source amplifier with source degeneration, for a second case of selected device parameters.
Figure 10:
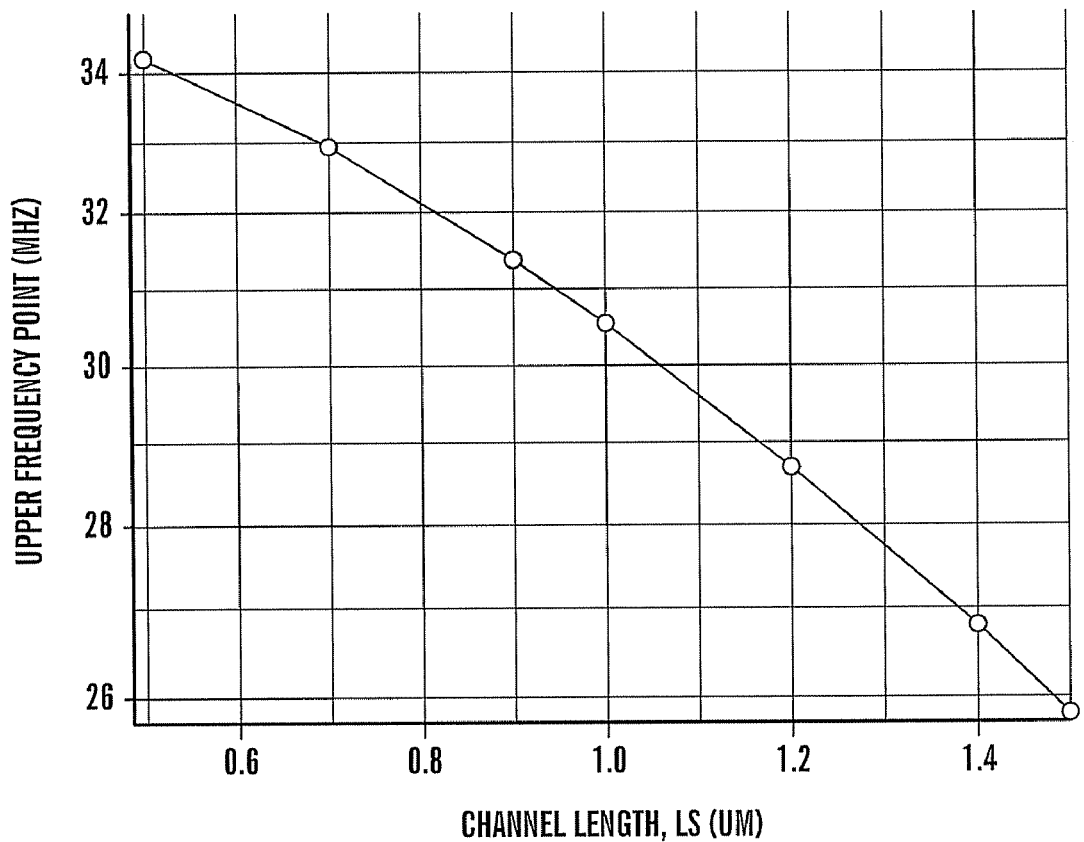
FIG. 10 is a graph illustrating the −3 dB upper frequency point as a function of channel length of the common source amplifier with source degeneration, for the second case of selected device parameters.
Figure 11:
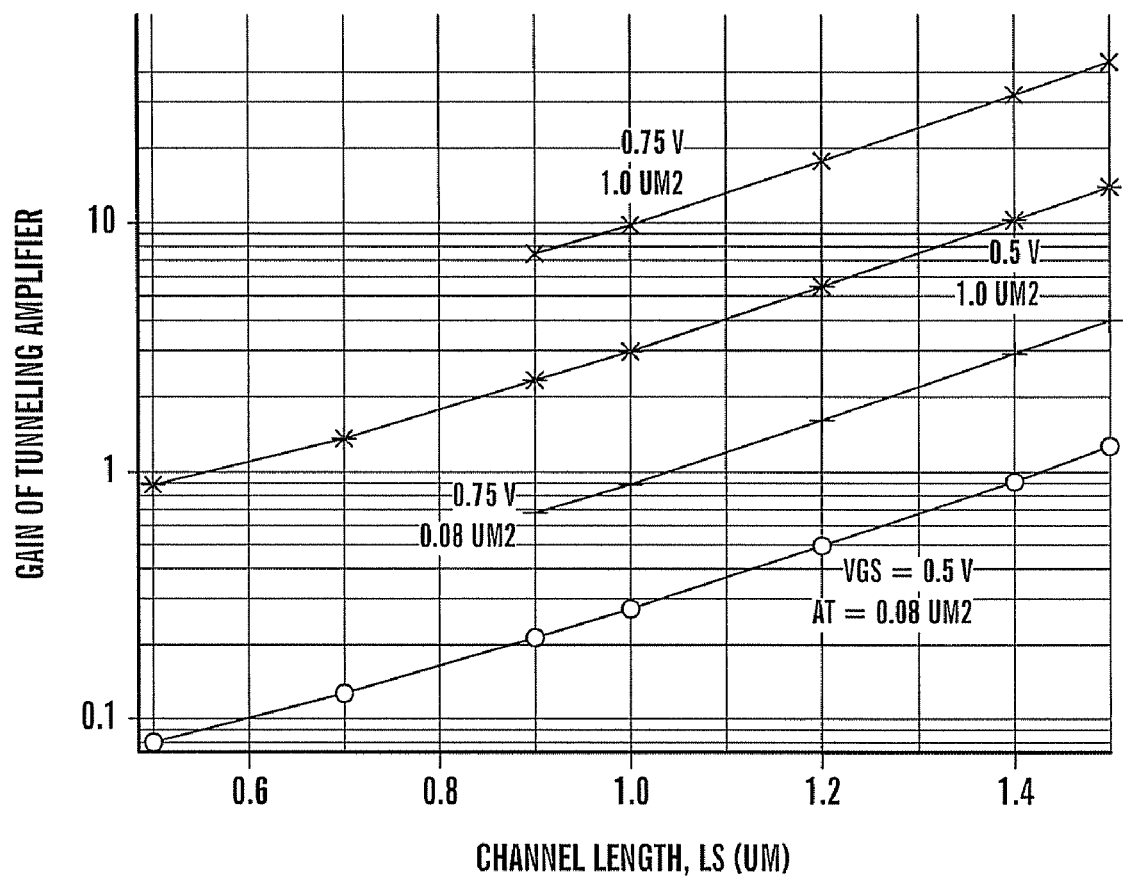
FIG. 11 is a graph illustrating the gain of tunneling amplifier as a function of channel length of the common source amplifier with source degeneration, for a third case of selected device parameters.
Figure 12:
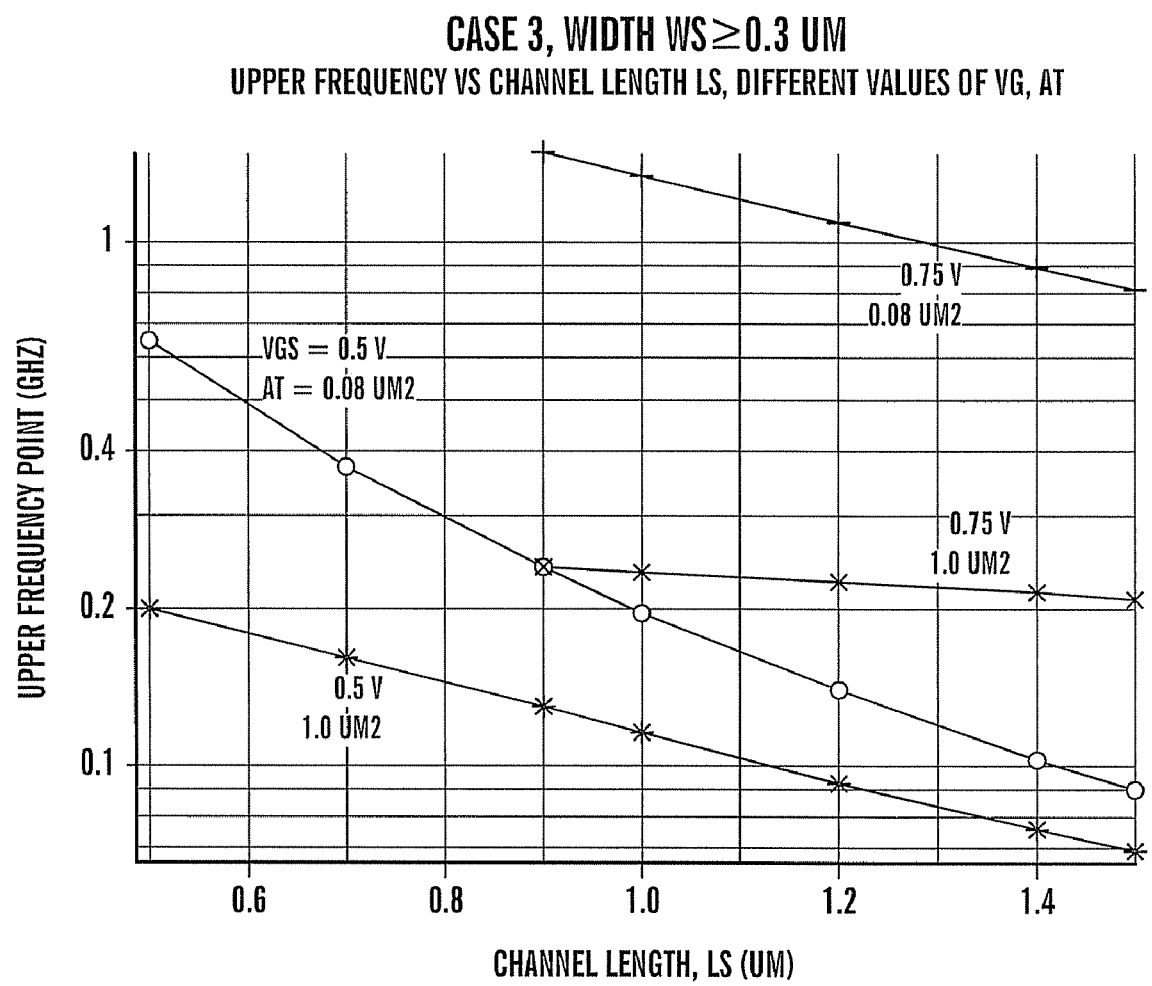
FIG. 12 is a graph illustrating the −3 dB upper frequency point as a function of channel length of the common source amplifier with source degeneration, for the third case of selected device parameters.
Figure 13:
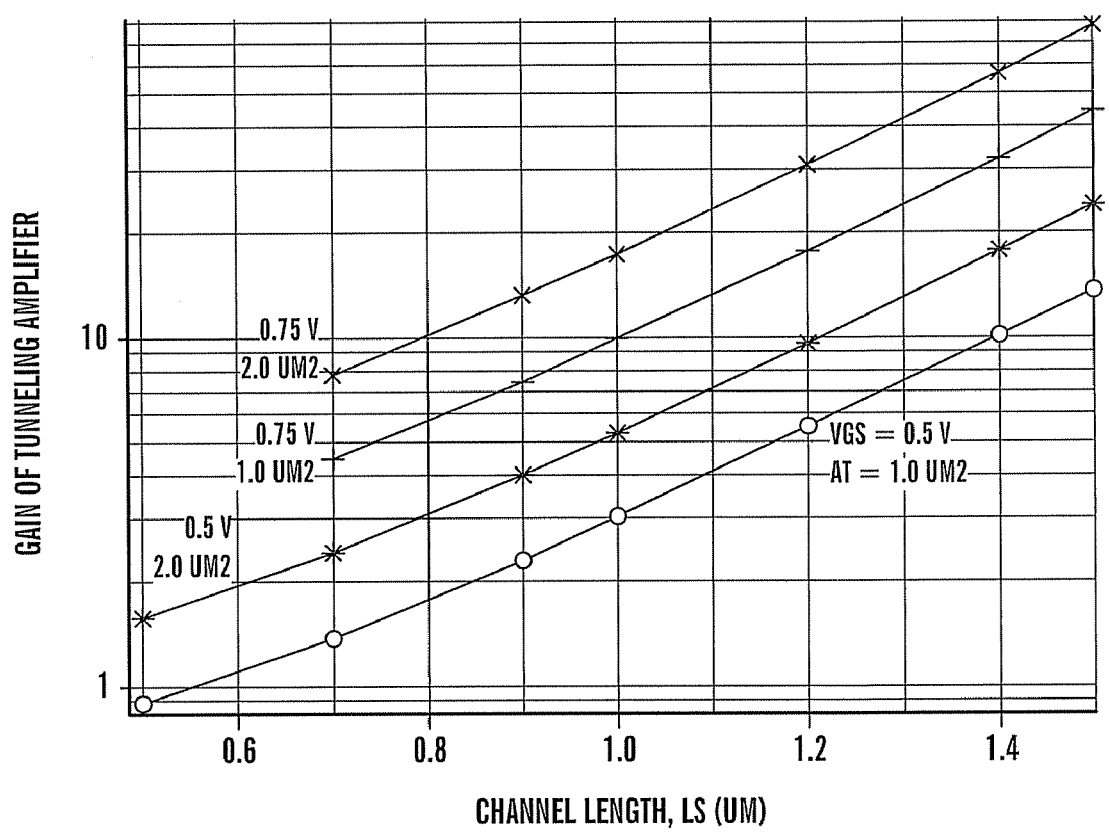
FIG. 13 is a graph illustrating the gain of tunneling amplifier as a function of channel length of the common source amplifier with source degeneration, for a fourth case of selected device parameters.
Figure 14:
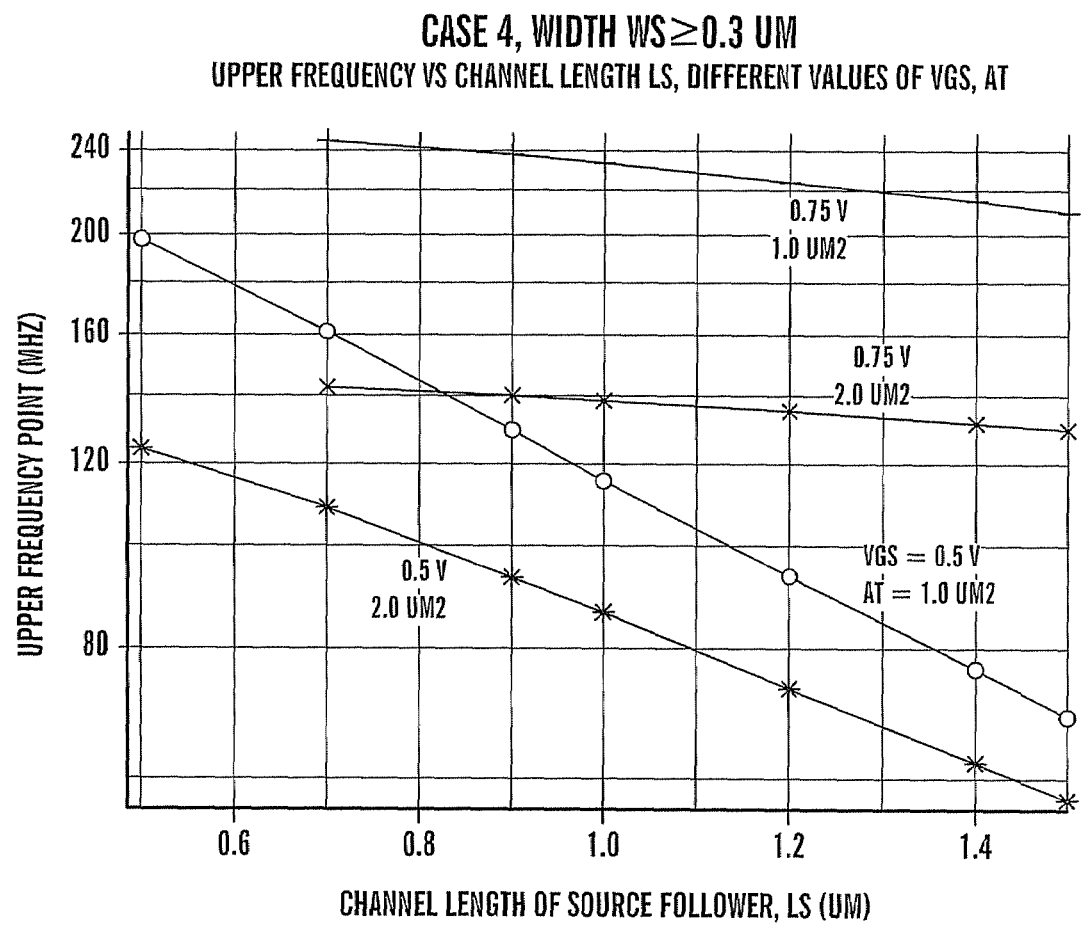
FIG. 14 is a graph illustrating the −3 dB upper frequency point as a function of channel length of the common source amplifier with source degeneration, for the fourth case of selected device parameters.

Using the parameters specified in Case 2, FIGS. 9 and 10 illustrate, respectively, the gain and $F_U$ as a function of channel length of the common source amplifier with source degeneration 102. In this example, $T_{ox}$ for the tunneling FET 104 is increased to 1.2 nm (from 1.0 nm in case 1), thereby causing $F_U$ to be lower than for Case 1 but without affecting the gain. In Case 3, a constant current source of 2 mA is added as compared to the parameters of Case 2. The gain and $F_U$ as a function of channel length of the common source amplifier with source degeneration 102 are shown in FIGS. 11 and 12, respectively. Consistent with the trends depicted in Table 1, the gain in Case 3 is lower than that for Cases 1 and 2, while the −3 dB point is higher. Lastly, for Case 4, $F_U$ is increased with respect to Case 3 as the area of the tunneling FET 104 is increased. Again, the gain and $F_U$ as a function of channel length of the common source amplifier with source degeneration 102 are shown in FIGS. 13 and 14, respectively.

Figure 15:
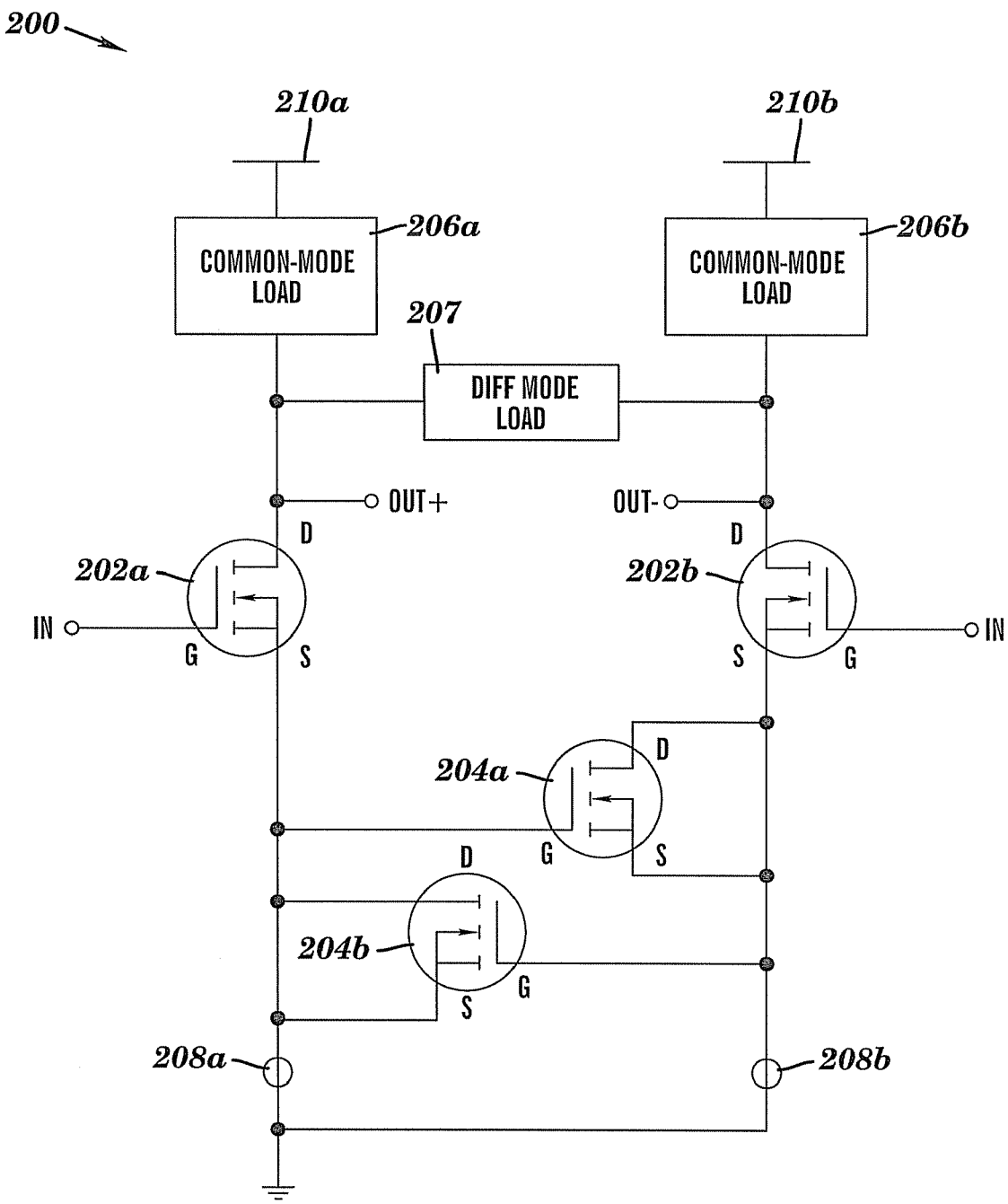
FIG. 15 is a schematic diagram illustrating a differential version of a tunneling amplifier circuit, in accordance with a further embodiment of the invention.

Finally, FIG. 15 is a schematic diagram illustrating a differential version of a tunneling amplifier circuit 200, in accordance with a further embodiment of the invention. As is shown, the differential tunneling amplifier circuit 200 includes a pair common source amplifiers with source degeneration 202a, 202b, the gate terminals of which represent the differential voltage input. In addition, a pair of tunneling gate FETs 204a, 204b, are used to set the transconductance of the circuit, wherein the tunneling gate FETs are cross-coupled to one another for equal loading on the differential pair. In other words, the gate terminal of tunneling FET 204a is coupled to the source of common source amplifier with source degeneration 202a, while the source and drain terminals of tunneling FET 204a are coupled to the source of common source amplifier with source degeneration 202b. Similarly, the gate terminal of tunneling FET 204b is coupled to the source of common source amplifier with source degeneration 202b, while the source and drain terminals of tunneling FET 204b are coupled to the source of common source amplifier with source degeneration 202a. Furthermore, in addition to a common-mode load circuit 206a, 206b coupled to the drain of respective common source amplifiers with source degeneration 202a, 202b, a differential-mode load circuit 207 may be coupled between the drain terminals of the common source amplifiers with source degeneration 202a, 202b. The differential mode load 207 could include, for example, back-to-back tunneling devices for precise gain control. It is further noted that the circuit 200 includes a pair of current sources 208a, 208b. Common-mode load 206a and 206b are connected, respectively, to supply voltages 210a and 210b.

As will be appreciated, the above described invention embodiments provide an amplifier circuit that advantageously utilizes the gate tunneling current of an ultra-thin oxide FET by using this current as the drain current for a thick oxide common source amplifier with source degeneration. As such, the transconductance $G_m$ of the amplifier circuit is dictated by the constant tunneling current, while the output conductance $G_{ds}$ is controlled by the common source amplifier with source degeneration. Accordingly, this configuration provides the capability of independent control of the transconductance and output conductance by designing a tunneling FET having an ultra thin gate oxide in conjunction with a common source amplifier with source degeneration with a thick gate oxide. Furthermore, the amplifier is resistant to hot carrier effects, and thus resistant to time dependent degradation of gain due to hot carriers.

Moreover, selective optimization of the gain and the −3 dB frequency point can be made with respect to several parameters such as $V_{ds}$, $V_{gs}$, channel length and width for common source amplifier with source degeneration, as well as area, gate voltage, and oxide thickness of the tunneling FET. In this manner, the particular selection of FET parameters may also be used, for example, to reduce the total area required for the amplifier circuit (i.e., to determine a trade off between performance and device area need). Still another means of optimizing the gain and frequency performance of the amplifier is through the use of a constant current source in parallel with the tunneling FET, which also allows for higher oxide thicknesses for the tunneling FET. In addition, as also disclosed herein, a differential form of the tunneling amplifier may be utilized for precise control of the circuit gain.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An integrated circuit amplifier, comprising:
    a first field effect transistor (FET) device configured as a common source amplifier with source degeneration; and
    a second FET device configured as a tunneling gate FET, said tunneling gate FET coupled to said common source amplifier with source degeneration;
    wherein said tunneling gate FET is further configured so as to set a transconductance of the amplifier and said common source amplifier with source degeneration is configured so as to set an output conductance of the amplifier.

2. The integrated circuit amplifier of claim 1, wherein a gate terminal of said tunneling gate PET is coupled to a source terminal of said common source amplifier with source degeneration.

3. The integrated circuit amplifier of claim 2, wherein an input terminal of the amplifier comprises a gate terminal of said common source amplifier with source degeneration and an output terminal of the amplifier further comprises a drain terminal of said common source amplifier with source degeneration.

4. The integrated circuit amplifier of claim 2, wherein a source terminal and a drain terminal of said tunneling gate PET are coupled to one another.

5. The integrated circuit amplifier of claim 2, further comprising a constant current source in parallel with said tunneling gate PET.

6. The integrated circuit amplifier of claim 3, further comprising a load circuit coupled to said drain terminal of said common source amplifier with source degeneration.

7. The integrated circuit amplifier of claim 1, wherein said common source amplifier with source degeneration has a gate oxide thickness of about 4.0 nanometers (nm) to about 7.0 nm, and said tunneling gate FET has a gate oxide thickness of about 0.8 nm to about 2.2 nm.

8. The integrated circuit amplifier of claim 1, wherein said output conductance set by said common source amplifier with source degeneration is less than said transconductance set by said tunneling gate FET.

9. An integrated circuit differential amplifier, comprising:
    a first field effect transistor (FET) device configured as a first common source amplifier with source degeneration;
    a second FET device configured as a second common source amplifier with source degeneration;
    a third FET device configured as a first tunneling gate FET, said first tunneling gate FET coupled between said first common source amplifier with source degeneration and said second common source amplifier with source degeneration; and
    a fourth FET device configured as a second tunneling gate FET, said second tunneling gate FET coupled between said first common source amplifier with source degeneration and said second common source amplifier with source degeneration;
    wherein said first and second tunneling gate FETs are further configured so as to set a transconductance of the differential amplifier and said first and second common source amplifiers with source degeneration are configured so as to set an output conductance of the differential amplifier.

10. The integrated circuit differential amplifier of claim 9, wherein:
    a gate terminal of said first tunneling gate FET is coupled to a source terminal of said first common source amplifier with source degeneration;
    a source and a drain terminal of said first tunneling gate FET is coupled to a source terminal of said second common source amplifier with source degeneration;
    a gate terminal of said second tunneling gate FET is coupled to said source terminal of said second common source amplifier with source degeneration;
    a source and a drain terminal of said second tunneling gate FET is coupled to said source terminal of said first common source amplifier with source degeneration.

11. The integrated circuit differential amplifier of claim 10, wherein:
    an input terminal pair of the differential amplifier comprises a gate terminal of said first common source amplifier with source degeneration and a gate terminal of said second common source amplifier with source degeneration; and
    an output terminal pair of the differential amplifier further comprises a drain terminal of said first common source amplifier with source degeneration and a drain terminal of said second common source amplifier with source degeneration.

12. The integrated circuit differential amplifier of claim 10, further comprising:
    a first common-mode load circuit coupled to said drain terminal of said first common source amplifier with source degeneration;

a second common-mode load circuit coupled to said drain terminal of said second common source amplifier with source degeneration;

a differential-mode load circuit coupled between said drain terminal of said first common source amplifier with source degeneration and drain terminal of said second common source amplifier with source degeneration.

13. The integrated circuit differential amplifier of claim 10, wherein said output conductance set by said first and second common source amplifiers with source degeneration is less than said transconductance set by said first and second tunneling gate FETs.

14. A method for implementing an integrated circuit amplifier, the method comprising:

configuring a first field effect transistor (FET) device as a common source amplifier with source degeneration; and configuring a second FET device as a tunneling gate FET coupled to said common source amplifier with source degeneration;

wherein said tunneling gate FET is further configured so as to set a transconductance of the amplifier and said common source amplifier with source degeneration is configured so as to set an output conductance of the amplifier.

15. The method of claim 14, wherein a gate terminal of said tunneling gate FET is coupled to a source terminal of said common source amplifier with source degeneration.

16. The method of claim 15, wherein:

an input terminal of the amplifier comprises a gate terminal of said common source amplifier with source degeneration and an output terminal of the amplifier further comprises a drain terminal of said common source amplifier with source degeneration; and a source terminal and a drain terminal of said tunneling gate FET are coupled to one another.

17. The method of claim 15, further comprising configuring a constant current source in parallel with said tunneling gate FET.

18. The method of claim 14, further comprising independently selecting a first set of FET device parameters with respect to a second set of FET device parameters so as to determine a desired amplifier gain and a desired amplifier frequency response.

19. The method of claim 18, wherein:

said first set of FET device parameters includes at least one of: a channel length of said common source amplifier with source degeneration, a gate-to-source voltage of said common source amplifier with source degeneration, and a gate oxide thickness of said tunneling gate FET; and said second set of FET device parameters includes at least one of: a current density of said tunneling gate FET, a channel width of said tunneling gate FET and a channel length of said tunneling gate FET.

20. The method of claim 18, wherein:

said first set of FET device parameters includes at least one of: a channel length of said common source amplifier with source degeneration, a gate-to-source voltage of said common source amplifier with source degeneration, a gate oxide thickness of said tunneling gate FET, a current value of a constant current source configured in parallel with said tunneling gate FET, and an area of said tunneling gate FET; and said second set of FET device parameters includes at least one of: a current density of said tunneling gate FET.

* * * * *